(12) United States Patent
Cote et al.

(10) Patent No.: US 7,732,866 B2
(45) Date of Patent: Jun. 8, 2010

(54) GROUNDING FRONT-END-OF-LINE STRUCTURES ON A SOI SUBSTRATE

(75) Inventors: William J. Cote, Poughquag, NY (US); Oliver D. Patterson, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 12/348,438

(22) Filed: Jan. 5, 2009

(65) Prior Publication Data
US 2009/0146211 A1   Jun. 11, 2009

Related U.S. Application Data

(63) Continuation of application No. 11/308,408, filed on Mar. 22, 2006, now Pat. No. 7,518,190.

(51) Int. Cl.
H01L 23/62 (2006.01)
(52) U.S. Cl. .................. 257/347; 257/355; 438/149; 438/479
(58) Field of Classification Search .................. 257/347, 257/355; 438/149, 479
See application file for complete search history.

(56) References Cited

U.S. PATENT DOCUMENTS

| | | | |
|---|---|---|---|
| 5,557,135 | A | 9/1996 | Hashimoto |
| 5,959,459 | A | 9/1999 | Satya et al. |
| 6,049,109 | A | 4/2000 | Omura et al. |
| 6,452,412 | B1 | 9/2002 | Jarvis et al. |
| 6,720,779 | B1 | 4/2004 | Lee |
| 6,727,501 | B1 | 4/2004 | Fan et al. |
| 6,855,568 | B2 | 2/2005 | Weiner et al. |
| 6,861,666 | B1 | 3/2005 | Weiner et al. |
| 2002/0151091 | A1 | 10/2002 | Shaw et al. |
| 2003/0071262 | A1 | 4/2003 | Weiner et al. |
| 2003/0098706 | A1 | 5/2003 | Schroeder |
| 2003/0234430 | A1 | 12/2003 | Friend et al. |

OTHER PUBLICATIONS

Wang et al., "The Study and Methodology of Defects Isolation for Contacts of Non-isolated Active Regions on New Logic Designs," ASM International, Proceedings of the 31st International Symposium for Testing and Failure Analysis, San Jose, California, Nov. 2005, pp. 479-483.
Baltzinger et al., "E-beam inspection of dislocations: product monitoring and process change validation," IEEE Proceedings of ASMC, 2004, pp. 359-366.
Patterson et al., "Rapid Reduction of Gate-Level Electrical Defectivity using Voltage Contrast Test Structures," Proceedings of ASMC, Mar. 2003, pp. 266-272.
Weiner et al., "Defect Management for 300 mm and 130 nm Technologies, Part 3: Another Day, Another Yield Learning Cycle," Yield Management Solutions, 2002, pp. 15-28.

*Primary Examiner*—Douglas M Menz
(74) *Attorney, Agent, or Firm*—Katherine Brown; Hoffman Warnick LLC

(57) ABSTRACT

Structures and a method are disclosed for grounding gate-stack and/or silicon active region front-end-of-line structures on a silicon-on-insulator (SOI) substrate, which may be used as test structures for VC inspection. In one embodiment, a structure includes a grounded bulk silicon substrate having the SOI substrate thereover, the SOI substrate including a silicon-on-insulator (SOI) layer and a buried oxide (BOX) layer; the silicon active region having at least one finger element within the SOI layer, the at least one finger element isolated by a shallow trench isolation (STI) layer; and a polysilicon ground intersecting the at least one finger element and extending through the STI layer and the BOX layer to the grounded bulk silicon substrate, the polysilicon ground contacting the silicon active region and the grounded bulk silicon substrate.

20 Claims, 5 Drawing Sheets

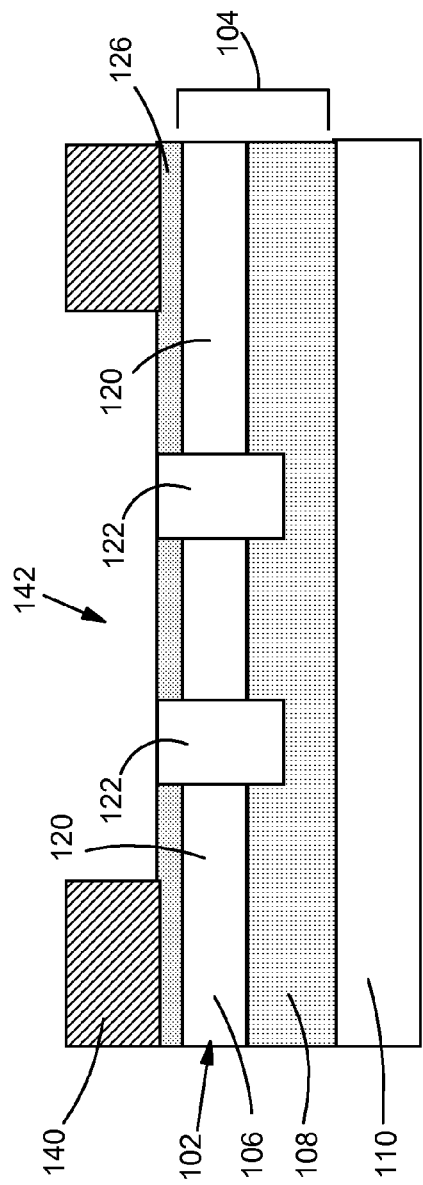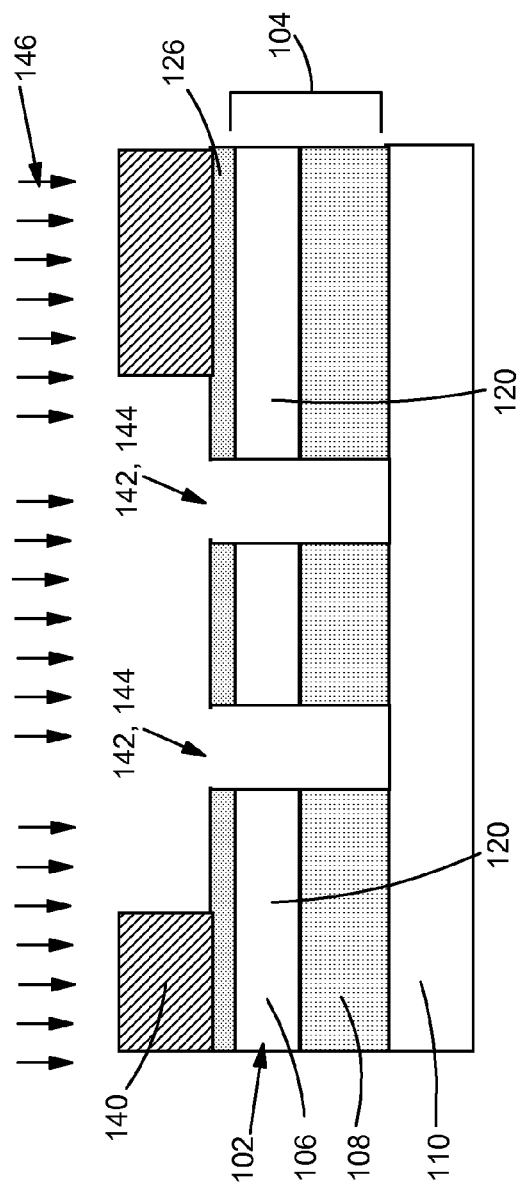

GROUNDING FRONT-END-OF-LINE STRUCTURES ON A SOI SUBSTRATE

This application is a continuation patent application of U.S. patent application Ser. No. 11/308,408, filed on Mar. 22, 2006 now U.S. Pat. No. 7,518,190, currently allowed.

BACKGROUND OF THE INVENTION

1. Technical Field

The invention relates generally to semiconductor fabrication, and more particularly, to structures and a method for grounding front-end-of-line (FEOL) structures, such as a gate stack or active region, through a silicon-on-insulator (SOI) substrate.

2. Background Art

In-line voltage contrast (VC) inspection is a powerful technique for detecting and isolating yield limiting defects in the semiconductor fabricating industry. In-line VC inspection includes scanning the wafer surface in which test structures exist with a scanning electron microscope (SEM). As the inspection proceeds, the SEM induces a charge on all electrically floating elements whereas any grounded elements remain at a zero potential. This potential difference is visible to the SEM. In particular, for electron landing energies less than the second crossover of the secondary electron yield curve (approximately 1.5 keV for tungsten (W) and copper (Cu)), grounded elements appear bright whereas floating elements appear dark.

Test structures exploiting this phenomenon can be created for many yield limiting defects including metal, gate and active region shorts and opens, and via and contact opens. For example, FIGS. 1A-B, show a short (FIG. 1B) indicated by a normally floating (dark) element becoming bright, and an open (FIG. 1A) indicated when a normally bright element becomes dark. As shown, even if the defect causing the electrical failure is buried or extremely small, its existence is indicated by a change in the VC signal of the entire element. In addition, the exact location of an open is indicated by a change in the VC signal of the structure after the break.

A number of challenges exist relative to building VC test structures. One challenge is grounding front-end-of-line (FEOL) structures targeting the active region or gate stack levels, especially for silicon-on-insulator (SOI) technology. For bulk silicon technology, an active region may be grounded to the substrate by doping the active region P+, while masking out the N well so that the P+ directly contacts the P− material of the substrate. However, with SOI technology, the buried oxide (BOX) layer presents an additional barrier so the above-described grounding technique does not work. Some SOI technologies provide a mask level for forming holes through the BOX layer. Design rules typically do not allow this level and the active region or gate stack levels to be coincident. However, this level enables the first metal level to make contact to the substrate. Since the active region and gate stack levels also can be connected to the first metal level, they may be grounded through as shown in FIG. 2. Unfortunately this ground path is not helpful for VC inspection for active region and gate stack structures because the ground path to the VC test structure is required when the test structure is still exposed at the wafer surface and visible to the SEM. Therefore, VC test structures that require grounding of an active region are currently impossible for SOI technology.

Several approaches exist to ground polysilicon structures in SOI substrates. For example, Patterson et al., "Rapid Reduction of Poly-Silicon Electrical D0 using uLoop Test Structures," Proceedings of ASMC, pp. 266-272, March 2003, describes the use of a modified process flow for generating grounded gate stack VC test structures. This short loop sequence starts with the formation of a 2000 angstrom (Å) silicon dioxide ($SiO_2$) layer. Contact holes are patterned in the silicon dioxide ($SiO_2$). The contacts are opened with an isotropic etch. The gate stack excluding the gate dielectric (e.g., $SiO_2$) is then deposited. Gate stack VC test structures are then formed using the contact holes to ground select elements. This method has a number of disadvantages. First, special short loop wafers are necessary, which creates an additional cost. Second, because the transistors will not work, very little other data can be collected for comparison. Third, the process sequence is not entirely representative of the real process.

A second technique to ground gate stack structures in SOI technology is to use large capacitors to generate a virtual ground path. This technique also suffers from a number of drawbacks. First, these capacitors are formed with a plate of gate stack over the active region, and take up a large amount of the area (e.g., approximately 25-40% of a test area). Secondly, a large plate of gate stack is often a design rule violation. A third technique for grounding the gate stack level is through the first metal layer, as described earlier. Again, this method is not useful for VC inspection because the ground path to the VC test structures is required when the test structures are still exposed at the wafer surface. By the first metal level, the test structures have been covered by the contact dielectric.

In view of the foregoing, there is a need in the art for a solution to the problems of the related art.

SUMMARY OF THE INVENTION

Structures and a method are disclosed for grounding gate-stack and/or silicon active region front-end-of-line structures on a silicon-on-insulator (SOI) substrate, which may be used as test structures for VC inspection. In one embodiment, a structure includes a grounded bulk silicon substrate having the SOI substrate thereover, the SOI substrate including a silicon-on-insulator (SOI) layer and a buried oxide (BOX) layer; a silicon active region having at least one finger element within the SOI layer, the at least one finger element isolated by a shallow trench isolation (STI) layer; and a polysilicon ground intersecting the at least one finger element and extending through the STI layer and the BOX layer to the grounded bulk silicon substrate, the polysilicon ground contacting the silicon active region and the grounded bulk silicon substrate.

A first aspect of the invention provides a structure comprising: a grounded bulk silicon substrate having a silicon-on-insulator (SOI) substrate thereover, the SOI substrate including a silicon-on-insulator (SOI) layer and a buried oxide (BOX) layer; a silicon active region having at least one finger element within the SOI layer, the at least one finger element isolated by a shallow trench isolation (STI) layer; and a polysilicon ground intersecting the at least one finger element and extending through the STI layer and the BOX layer to the grounded bulk silicon substrate, the polysilicon ground contacting the silicon active region and the grounded bulk silicon substrate.

A second aspect of the invention provides a method of grounding a silicon active region within a silicon-on-insulator (SOI) substrate prior to contact dielectric formation, the method comprising the steps of: providing the SOI substrate including a silicon-on-insulator (SOI) layer and a buried oxide (BOX) layer, the SOI substrate positioned over a grounded bulk silicon substrate; forming the silicon active region having at least one finger element within the SOI layer, the at least one finger element isolated by a shallow trench isolation (STI) layer; and forming a polysilicon ground intersecting the at least one finger element and extending through the STI layer and the BOX layer to the grounded bulk silicon substrate, the polysilicon ground contacting the silicon active region and the grounded bulk silicon substrate.

A third aspect of the invention provides a structure for grounding a gate stack through a silicon-on-insulator (SOI) substrate, the structure comprising: a bulk silicon substrate having the SOI substrate thereover, the SOI substrate including a silicon-on-insulator (SOI) layer on top of a buried oxide (BOX) layer; a polysilicon ground extending through the SOI layer and the BOX layer to the bulk silicon substrate; and a gate oxide layer of the gate stack on an upper surface of the polysilicon ground, the gate oxide layer being insufficiently insulative to prevent electrical conductivity therethrough, wherein the gate stack contacts the polysilicon oxide layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 5-6 show steps of forming the structure of FIG. 3.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1B:
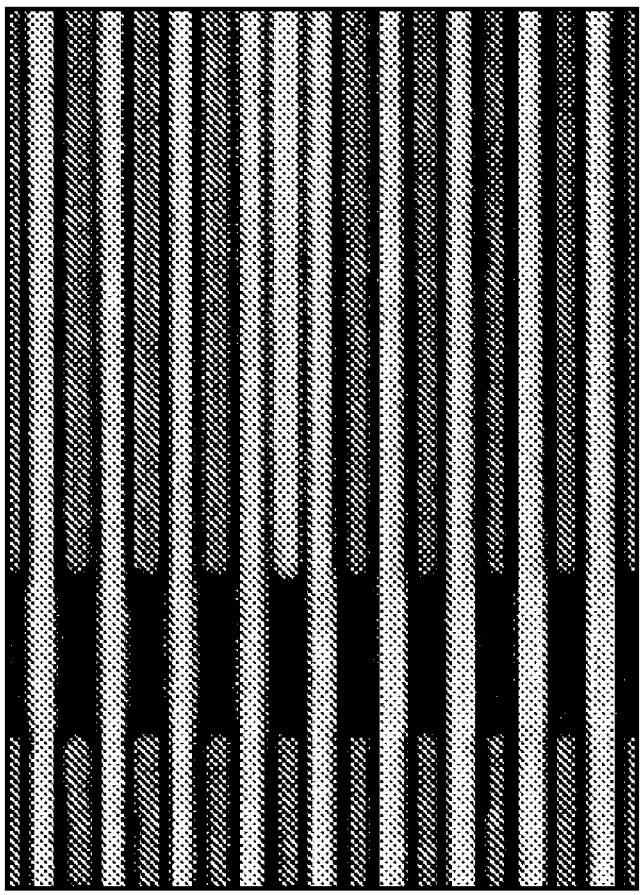
FIG. 1 shows images of defects observed using conventional VC inspection.
Figure 1A:
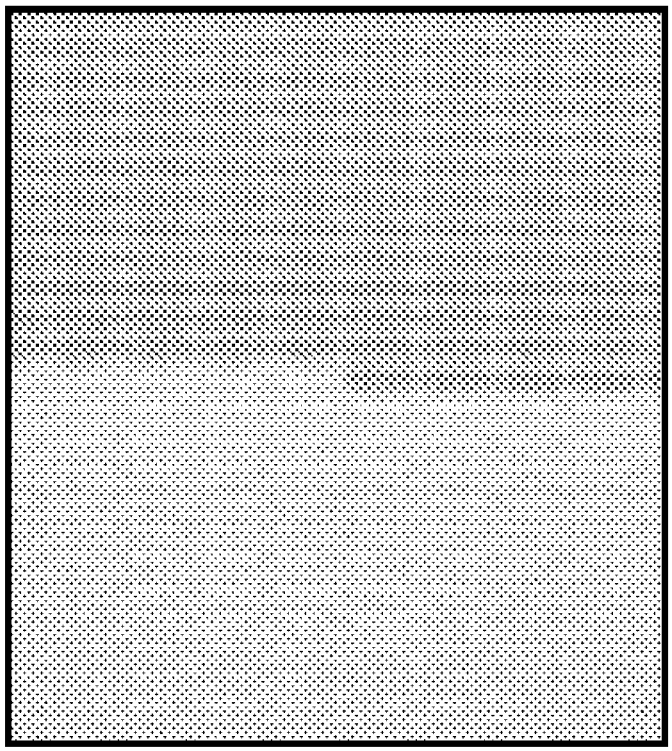
Figure 2:
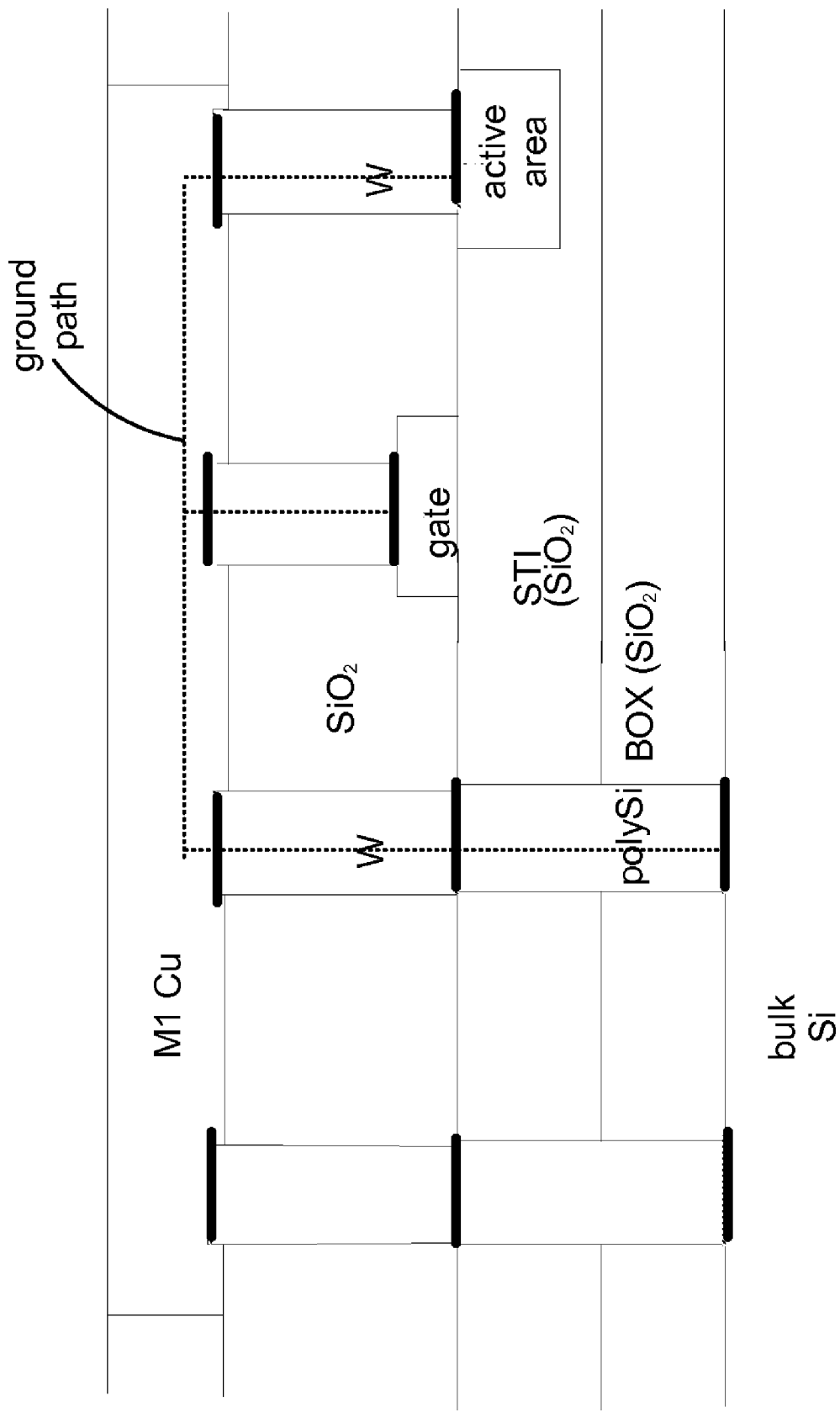
FIG. 2 shows a conventional approach to grounding an active region.
Figure 3:
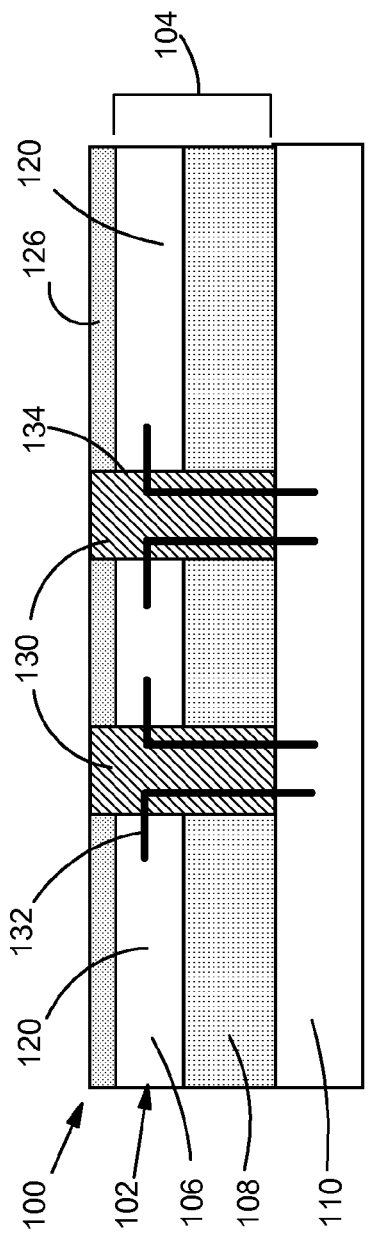
FIGS. 3-4 show a first embodiment of a structure according to the invention.

Turning to the drawings, FIG. 3 shows one embodiment of a structure 100 for grounding a silicon active region 102 within a silicon-on-insulator (SOI) substrate 104. SOI substrate 104 includes a silicon-on-insulator (SOI) layer 106 and a buried oxide (BOX) layer 108. Silicon active region 102 is provided within SOI layer 106. Structure 100 includes a bulk silicon substrate 110 having SOI substrate 104 thereover. As shown in the top view of FIG. 4, silicon active region 102 includes at least one finger element 120 within SOI layer 106 (FIG. 3). In one embodiment, a plurality of finger elements 120 are within SOI layer 106. Each finger element 120 is isolated by a shallow trench isolation (STI) region 122 of, for example, silicon dioxide ($SiO_2$). For example, each finger element 120 is separated from an adjacent finger element 120 by STI region 122. STI region 122 is not shown in FIG. 3 because it has been replaced by polysilicon ground 130, as will be described below. FIG. 3 is viewing FIG. 4 along line 3-3. A masking layer 126, shown in FIG. 3 of, for example, silicon nitride ($Si_3N_4$) is shown removed in FIG. 4 (masking layer 126 may be used to form polysilicon ground 130). A polysilicon ground 130 intersects finger element(s) 120 and extends through masking layer 126, STI region 122 and BOX layer 108 to grounded bulk silicon substrate 110. In particular, polysilicon ground 130 replaces a part of STI region 122 adjacent to a finger element 120, if only one is provided, or between adjacent finger elements 120 where a plurality of finger elements 120 are provided. Polysilicon ground 130 contacts silicon active region 102 and grounded bulk silicon substrate 110 so as to provide a ground path 132 (only one labeled) from silicon active region 102 to grounded bulk silicon substrate 110. Polysilicon ground 130 contacts a sidewall 134 of silicon active region 102, i.e., a sidewall of a finger element 120. As such, silicon active region 102 may be advantageously used as part of a VC test structure. In addition, structure 100 may be used in a product chip and positioned for charge dissipation. Other regions of silicon active region 128 also may use polysilicon ground 130.

Turning to FIGS. 5 and 6, one embodiment of grounding silicon active region 102 within SOI substrate 104 prior to contact dielectric formation will now be described. FIGS. 5 and 6 also view FIG. 4 along line 3-3. In a first step, SOI substrate 104 including SOI layer 106 and BOX layer 108 is provided in any now known or later developed fashion. SOI substrate 104 is positioned over grounded bulk silicon substrate 110. Next, active silicon region 102 having at least one finger element 120 within SOI layer 106 is formed. Masking layer 126 is used to mask out the desired active silicon region 102. As noted above, and as shown in FIG. 4, each finger element 120 is separated from an adjacent finger element 120, by STI region 122. As such, finger element(s) 120 may be formed by any now known or later developed technique for forming STI region 122 within SOI layer 106.

Figure 4:
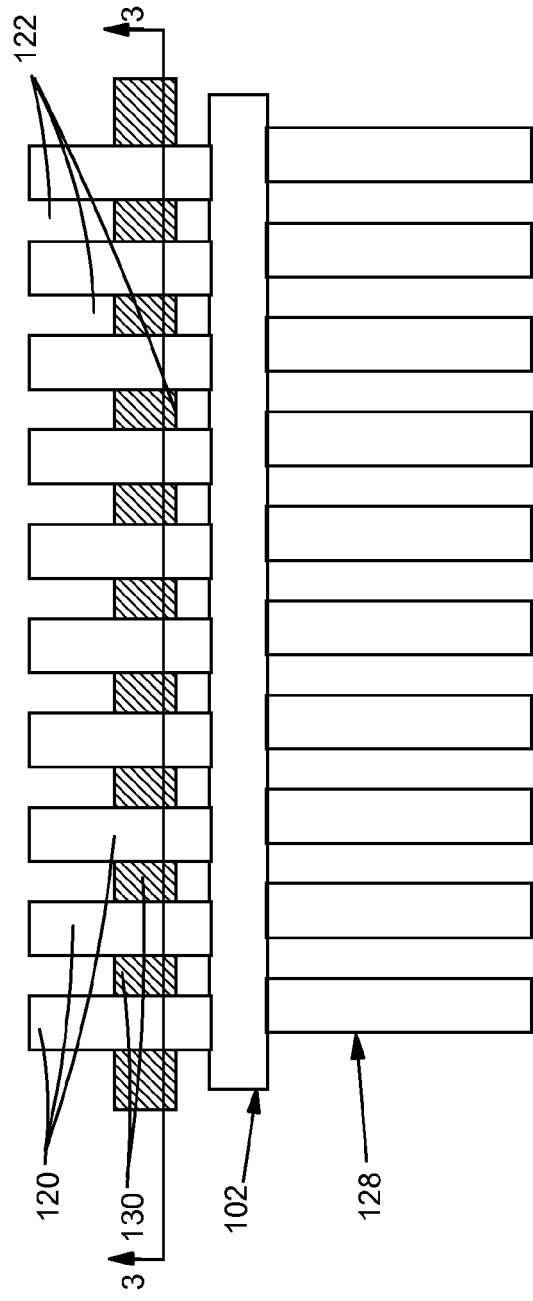

A next step includes forming polysilicon ground 130 (FIG. 3) intersecting finger element(s) 120 and extending through STI regions 122 in layer 106 and through BOX layer 108 to grounded bulk silicon substrate 110. Polysilicon ground 130 (FIG. 3) contacts silicon active region 102, via finger element(s) 120, and grounded bulk silicon substrate 110. As shown starting in FIGS. 5 and 6, this step may include forming a mask 140 having an opening 142 substantially orthogonal to plurality of finger elements 120 and STI region 122 (FIG. 4) therebetween. Next, as shown in FIG. 6, etching 146 is performed through barrier layer 126 (if provided), STI region 122 (FIG. 5) and BOX layer 108 to grounded bulk silicon substrate 110 to form a ground opening 144. In particular, a portion of STI region 122 is removed adjacent to a finger element 120 where one is provided, or between at least two of a plurality of finger elements 120, through BOX layer 108 to grounded bulk silicon substrate 110 to form a ground opening 144. Etching 146 may include any now known or later developed chemistries appropriate for the layers being etched. In one embodiment, opening 142 and hence, ground opening 144, is formed as a trench. That is, a ground opening trench would be formed in the areas where polysilicon ground 130 is shown in FIG. 4 such that polysilicon ground 130 includes a polysilicon filled trench. After etching 146, a pre-clean may be provided. Next, as shown in FIG. 3, a polysilicon is deposited in ground opening 144 (FIG. 6), and the polysilicon is planarized to arrive at structure 100. Active region 102 is thus grounded by the time that active region 102 is formed and doped.

Figure 7:
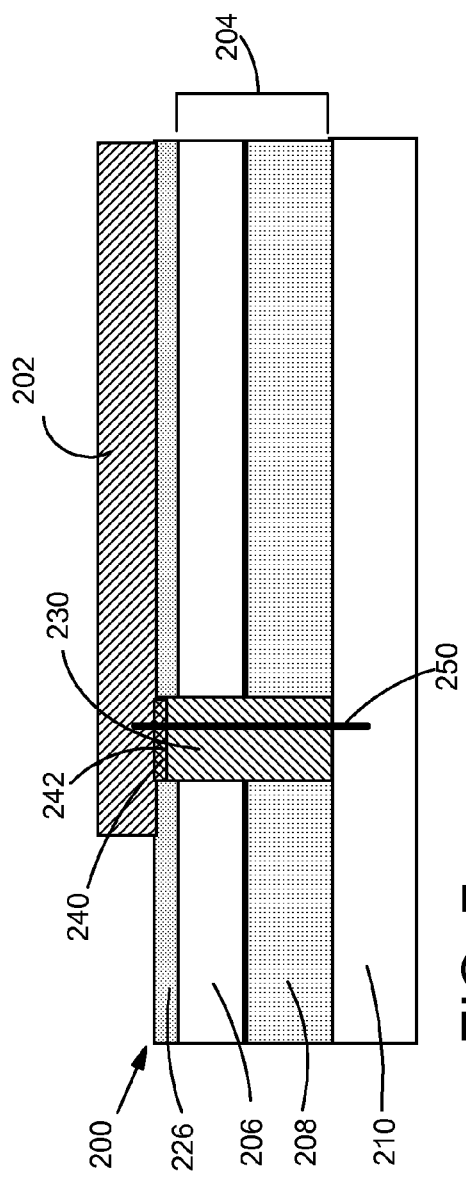
FIGS. 7 and 8 show a second embodiment of a structure according to the invention.
Figure 8:
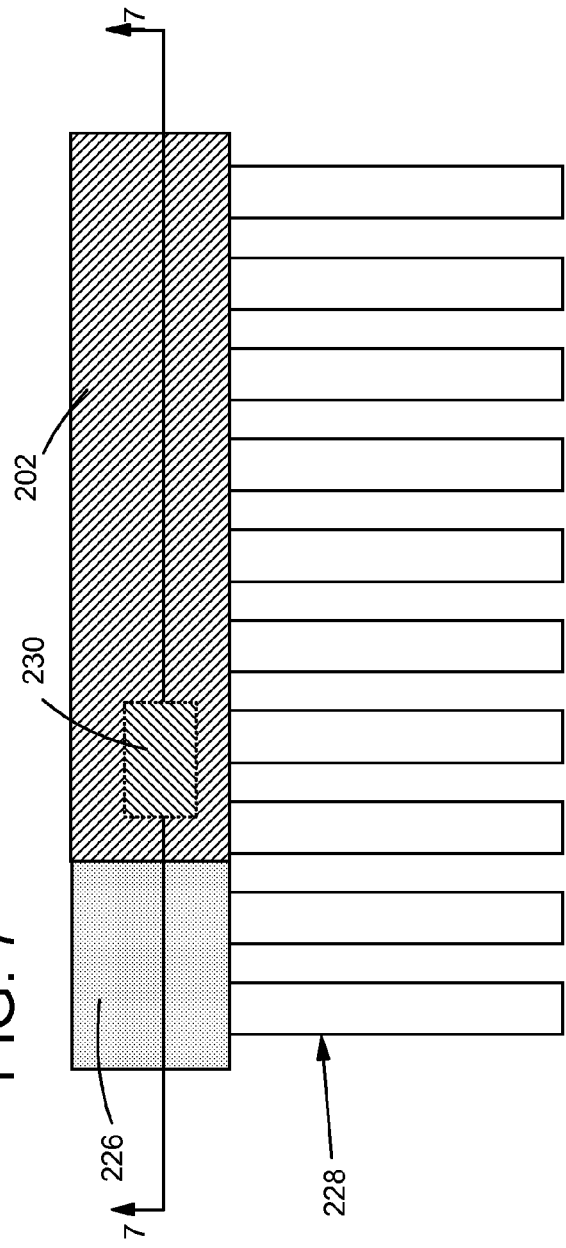

Turning to FIGS. 7-8, one embodiment of a structure 200 for grounding a gate stack 202, e.g., of polysilicon, through an SOI substrate 204 will now be described. FIG. 8 shows structure 200 with most of a barrier layer 226 removed for clarity (not actually). SOI substrate 204 includes SOI layer 206 and BOX layer 208. Structure 200 may also include other test structures 228 and other gate stacks (not shown), which utilize polysilicon ground 230, described below. Structure 200 may include bulk silicon substrate 210 having SOI substrate 204 thereover. A polysilicon ground 230 extends through SOI layer 206 and BOX layer 208 to bulk silicon substrate 210. A polysilicon oxide (SiO$_2$) layer 240 is included on an upper surface 242 of polysilicon ground 230. Polysilicon oxide layer 240 is insufficiently insulative to prevent electrical conductivity therethrough. In one embodiment, upper surface 242 of polysilicon ground 230 is uneven so as to make polysilicon oxide layer 240 insufficiently insulative to prevent electrical conductivity therethrough. The polysilicon of gate stack 202 contacts polysilicon oxide layer 240. Note, polysilicon gate oxide layer 240 actually forms a part of gate stack 202. Because polysilicon oxide layer 240 is electrically leaky, it provides a ground path from polysilicon gate stack 202 to grounded bulk silicon substrate 210. Since structure 200 is present prior to formation of polysilicon gate stack 202, it may advantageously be used as a part of a VC test structure. In addition, structure 200 may be used in a product chip and positioned for charge dissipation.

Structure 200 may be formed by using a mask to form openings through SOI substrate 204. The openings are filled with polysilicon, and the surface is polished. However, the polysilicon of polysilicon ground 230 grows conformally so that the sides of the polysilicon crystals are exposed to the surface, i.e., the top of the opening. This exposed surface 242 results in a polysilicon that is more bumpy and uneven than the surface of polysilicon (e.g., polysilicon gate stack 202) grown vertically across much of the wafer surface. As a result, polysilicon oxide layer 240, i.e., gate dielectric, grown over this uneven upper surface 242 will be extremely leaky. By generating a large enough area where polysilicon gate stack 202 overlaps with masking level, a substantial ground path 250 may be created.

The above-described method and structures enables in-line VC inspection of gate stack and active regions on full flow wafers using standard processing despite the use of SOI technology. Using the above-described embodiments, VC test structures that require grounded active regions are now possible. The structures require very little area. In addition to in-line VC inspection, as noted above, structures 100, 200 may provide a ground path for charge dissipation within product chips during FEOL processing. Other applications besides FEOL VC inspection also can benefit from the above-described embodiments. For instance, grounding of an active region and/or gate stack levels might be useful to mitigate charge damage from reactive ion etching (RIE) processing.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A structure comprising:
    a grounded bulk silicon substrate having a silicon-on-insulator (SOI) substrate thereover, the SOI substrate including a silicon-on-insulator (SOI) layer and a buried oxide (BOX) layer;
    a silicon active region having at least one finger element within the SOI layer, the at least one finger element isolated by a shallow trench isolation (STI) layer; and
    a polysilicon ground intersecting the at least one finger element and extending through the STI layer and the BOX layer to the grounded bulk silicon substrate, the polysilicon ground contacting the silicon active region and the grounded bulk silicon substrate.

2. The structure of claim 1, wherein the at least one finger element includes a plurality of finger elements, each finger element separated from an adjacent finger element by a portion of the STI layer.

3. The structure of claim 1, wherein the silicon active region is a part of a voltage contrast test structure.

4. The structure of claim 1, wherein the silicon active region is part of a product chip and is positioned for charge dissipation.

5. The structure of claim 1, wherein the polysilicon ground includes a polysilicon filled trench.

6. The structure of claim 1, further comprising a barrier layer over the SOI layer, the polysilicon ground extending through the barrier layer.

7. The structure of claim 1, wherein the polysilicon ground contacts a sidewall of the silicon active region.

8. The structure of claim 1, wherein the polysilicon ground replaces a part of the STI layer between the plurality of finger elements.

9. A method of grounding a silicon active region within a silicon-on-insulator (SOI) substrate prior to contact dielectric formation, the method comprising the steps of:
    providing the SOI substrate including a silicon-on-insulator (SOI) layer and a buried oxide (BOX) layer, the SOI substrate positioned over a grounded bulk silicon substrate;
    forming the silicon active region having at least one finger element within the SOI layer, the at least one finger element isolated by a shallow trench isolation (STI) layer; and
    forming a polysilicon ground intersecting the at least one finger element and extending through the STI layer and the BOX layer to the grounded bulk silicon substrate, the polysilicon ground contacting the silicon active region and the grounded bulk silicon substrate.

10. The method of claim 9, wherein the at least one finger element includes a plurality of finger elements, each finger element separated from an adjacent finger element by a portion of the STI layer.

11. The method of claim 9, wherein the polysilicon ground forming step includes:
    forming a mask having an opening substantially orthogonal to the at least one finger element and the STI layer therebetween;
    removing a portion of the STI layer adjacent to the at least one finger element through the BOX layer to the grounded bulk silicon substrate to form a ground opening;
    depositing a polysilicon in the ground opening; and
    planarizing the polysilicon.

12. The method of claim 11, wherein the providing step further includes providing a barrier layer of the SOI substrate, and the removing step includes etching through the barrier layer.

13. The method of claim 9, wherein the polysilicon ground contacts a sidewall of the silicon active region.

14. The method of claim 9, wherein the silicon active region is a part of a voltage contrast test structure.

15. The method of claim 9, wherein the silicon active region is part of a product chip and is positioned for charge dissipation.

16. A structure for grounding a gate stack through a silicon-on-insulator (SOI) substrate, the structure comprising:
    a bulk silicon substrate having the SOI substrate thereover, the SOI substrate including a silicon-on-insulator (SOI) layer on top of a buried oxide (BOX) layer;

a polysilicon ground extending through the SOI layer and the BOX layer to the bulk silicon substrate; and a gate oxide layer of the gate stack on an upper surface of the polysilicon ground, the gate oxide layer being insufficiently insulative to prevent electrical conductivity therethrough, wherein the gate stack contacts the polysilicon oxide layer.

17. The structure of claim 16, wherein the upper surface of the polysilicon ground is uneven so as to make the polysilicon oxide layer insufficiently insulative to prevent electrical conductivity therethrough.

18. The structure of claim 16, wherein the gate stack is a part of a voltage contrast test structure.

19. The structure of claim 16, wherein the gate stack is part of a product chip and is positioned for charge dissipation.

20. The structure of claim 16, wherein the structure is present prior to formation of the gate stack.

* * * * *